United States Patent [19]

Pickering

[11] Patent Number: 5,369,245

[45] Date of Patent: Nov. 29, 1994

[54] METHOD AND APPARATUS FOR CONDITIONING AN ELECTRONIC COMPONENT HAVING A CHARACTERISTIC SUBJECT TO VARIATION WITH TEMPERATURE

[75] Inventor: John R. Pickering, Alderford, United Kingdom

[73] Assignee: Metron Designs Ltd., Alderford, United Kingdom

[21] Appl. No.: 922,989

[22] Filed: Jul. 30, 1992

[30] Foreign Application Priority Data

Jul. 31, 1991 [GB] United Kingdom ............ 9116539.9

[51] Int. Cl.$^5$ ............ H01L 27/00; H01L 49/00
[52] U.S. Cl. ............ 219/209; 324/158.1; 324/224; 324/767; 323/907; 437/248; 257/467; 327/513; 327/538
[58] Field of Search ........... 219/209, 210; 338/7; 324/158 F, 224, 670, 703, 158 D; 361/140, 274, 18; 330/272; 331/70; 323/907; 307/318, 310, 491, 503, 566; 257/469, 467; 437/248, 247

[56] References Cited

U.S. PATENT DOCUMENTS

| | | | |
|---|---|---|---|
| 2,639,246 | 5/1953 | Dunlap, Jr. ............ | 437/248 |
| 3,723,776 | 3/1973 | Schulz ............ | 307/318 |
| 4,114,096 | 9/1978 | Chinery ............ | 324/158 F |
| 4,323,793 | 4/1982 | Schutten et al. ............ | 307/310 |
| 4,345,218 | 8/1982 | Congdon et al. ............ | 361/103 |
| 4,562,400 | 12/1985 | Narasimhan ............ | 323/907 |
| 4,668,903 | 5/1987 | Elbert ............ | 323/907 |
| 4,775,838 | 10/1988 | Mizuta et al. ............ | 324/468 |
| 4,945,302 | 7/1990 | Janum ............ | 324/158 F |
| 5,061,642 | 10/1991 | Fujioka ............ | 437/248 |

FOREIGN PATENT DOCUMENTS

| | | |
|---|---|---|
| 3010718 | 9/1981 | Germany . |
| 57-21825 | 2/1982 | Japan ............ 437/247 |
| 2-166730 | 6/1990 | Japan ............ 437/247 |

OTHER PUBLICATIONS

Dobkin, R. C., "On–Chip Heater Helps to Stabilize Monolithic Reference Zener", Sep. 1976, *Electronics*, vol. 49, No. 19, pp. 106–112.

*Primary Examiner*—Bruce A. Reynolds
*Assistant Examiner*—John A. Jeffery
*Attorney, Agent, or Firm*—Florence U. Reynolds

[57] ABSTRACT

An electronic component is conditioned to remove distortion in a temperature response characteristic due to a temperature hysteresis effect, by subjecting the component to a controlled temperature variation prior to operation of the component at a given temperature. A circuit is disclosed wherein the component is a zener reference element and a bias voltage of cyclical waveform and of reducing magnitude is applied to a control transistor to cause corresponding variation of the temperature of the zener via an on-chip heater. The zener is subsequently operated at a normal bias voltage corresponding to the mean value of the cyclic waveform.

32 Claims, 5 Drawing Sheets

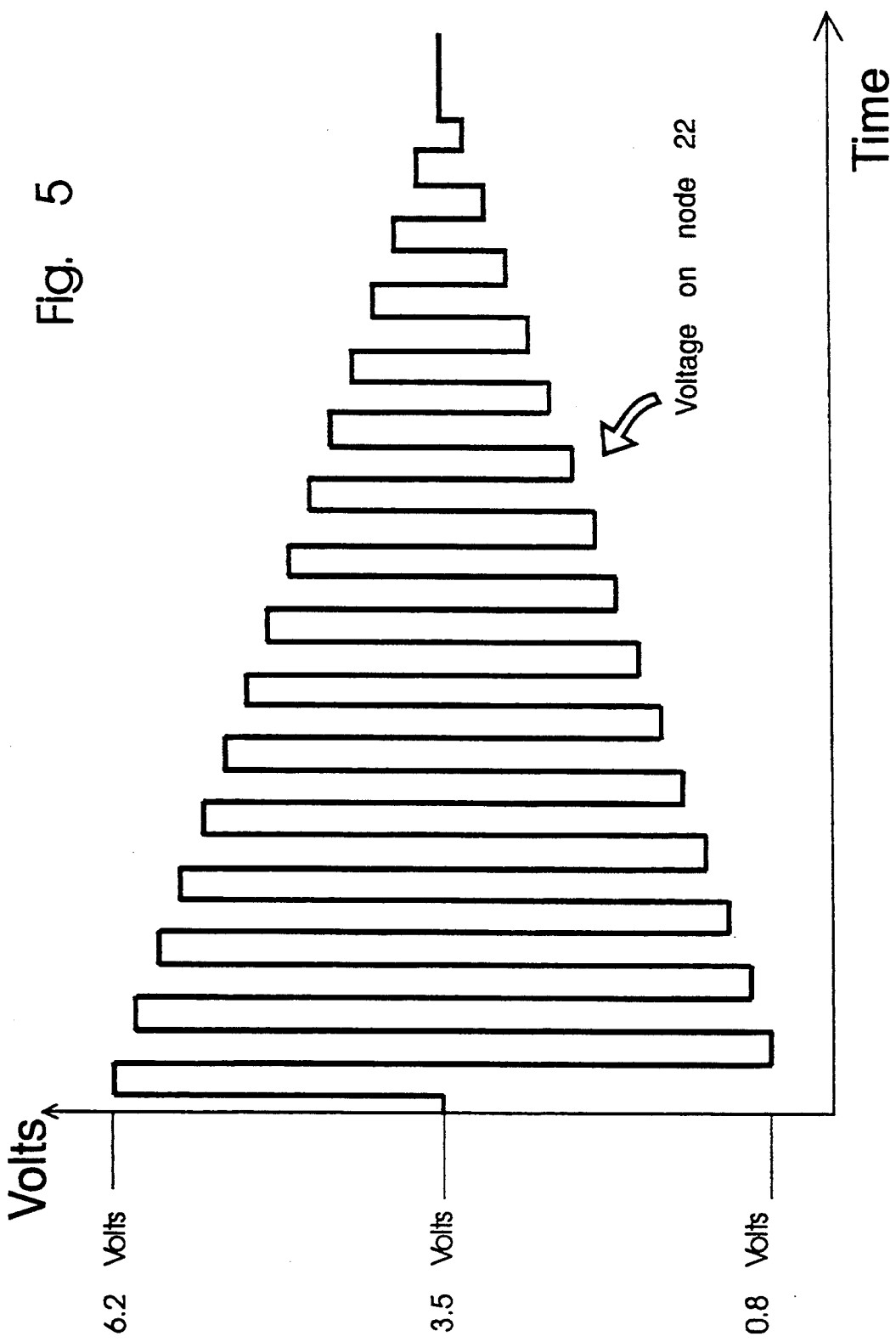

METHOD AND APPARATUS FOR CONDITIONING AN ELECTRONIC COMPONENT HAVING A CHARACTERISTIC SUBJECT TO VARIATION WITH TEMPERATURE

BACKGROUND OF THE INVENTION

This invention concerns a method and apparatus for conditioning an electronic component having a characteristic subject to distortion following a change in temperature.

Highly accurate electronic measuring or generating instruments such as DMMs, calibrators and transfer standards utilise precision electronic components as their internal reference sources. Sometimes these components are used virtually in isolation as transfer standards. Most common of these components is the zener diode or composite zener/transistor reference used for voltage references and the resistor used as a resistance or impedance reference.

For highest accuracies these components are usually operated at a controlled temperature either to limit errors due to variation of reference value with temperature or to protect the component from permanent or semi-permanent change in value due to operation at a non-normal temperature. It is the latter situation which is of interest because, typically, components subjected to temperature excursions away from their normal operating temperature exhibit a memory effect where the reference value changes following the temperature excursion and may or may not recover over a period of time. This is commonly referred to as temperature hysteresis and is thought to be due largely to mechanical stress being induced by the temperature excursion and some of it being "locked in".

However, when components of an apparatus have been subjected to extremes of temperature such as may occur during transport, even the subsequent operation thereof at a controlled temperature may be insufficient to restore such induced changes, and the accuracy of the apparatus will therefore become affected by gradual changes in the characteristics of precision components, or by a permanent but not irreversible stepwise change in value.

SUMMARY OF THE INVENTION

It is an object of the present invention to overcome the abovementioned disadvantages.

The invention accordingly provides a method of conditioning an electronic component having a characteristic subject to distortion following a change in temperature, wherein, prior to operating the component at a given temperature, the temperature of the component is controlled to vary relatively to said given temperature in such a direction and for such a period of time as to compensate for any inherent change in said characteristic due to temperature hysteresis effects. The term "given" temperature may include a normal ambient temperature, or a range of ambient temperatures.

A reasonable analogy to the temperature hysteresis effect referred to is the hysteresis and remanence well known to those versed in the art of magnet, electromagnet and transformer design. In a typical electromagnet an iron core is magnetised in a field produced by electrical current flowing in a coil. When the coil is de-energised some of the magnetism remains (with certain steels a "permanent" magnet is formed.) This remaining magnetism can be reduced to virtually zero by a process commonly known as de-Gaussing where an alternating field is applied to the coil and gradually reduced to zero magnitude during a conditioning (de-Gaussing) period.

Similar techniques may be applied to temperature variation in the method of the invention, and further preferred features and advantages of the invention will become apparent from the following description and the appended claims.

DETAILED DESCRIPTION OF PREFERRED EMBODIMENT

Figure 1:
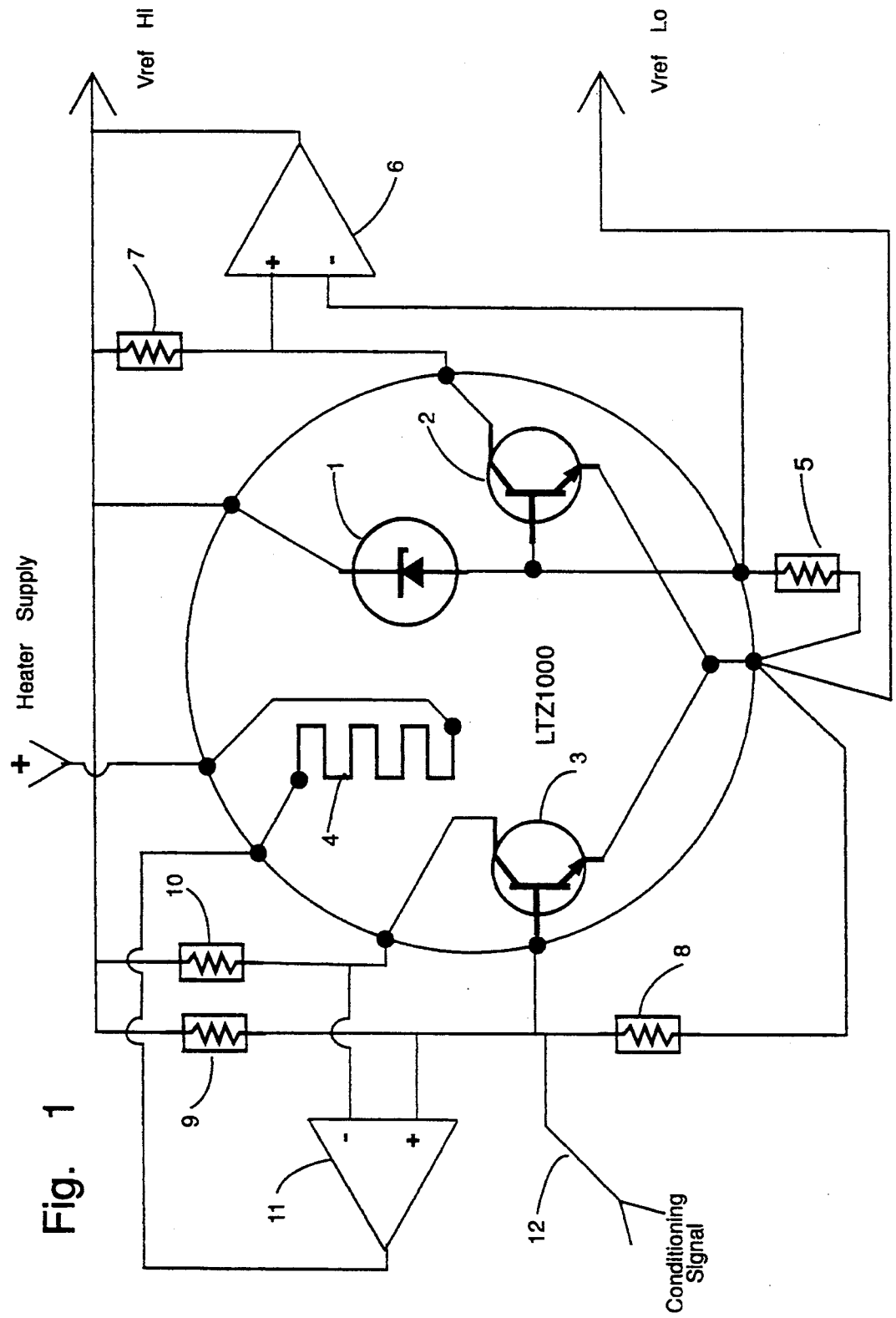
FIG. 1. is a circuit diagram of a precision electronic component and an associated control circuit for determining the temperature of the component during operation thereof.

In FIG. 1. is shown an example which is typical use of a Linear Technology Inc. LTZ1000 or LTZ1000A reference component with on chip heater which is used to maintain the device at constant temperature whilst power is maintained. The example chosen utilises an on-chip heater but the principal is the same for cases where the component is placed in an oven or fridge with controlled temperature. The basic circuit is similar to an example presented in the Linear Technology Inc. data book (1990).

In the circuit shown, components 1,2,3 and 4 are all on the LTZ1000 chip and are thus in very close thermal proximity since silicon is a good conductor of heat. 1 is the zener reference and 2 a compensating transistor. They have similar magnitude but opposite polarity temperature coefficients and when appropriately biased by resistor 5 defining the zener current and resistor 7 defining the collector current of transistor 2 a precision reference voltage is formed between the emitter of the transistor 2 and the cathode of the zener 1. Operational amplifier 6 supplies the current by holding the base collector voltage of transistor 2 at a constant near zero value. The temperature coefficients of 1 and 2 do not exactly cancel and so the whole chip is maintained at constant temperature using the heater 4 and a temperature sensing transistor 3. (A variation of the circuit would allow transistor 2 to be used both as part of the reference and as a temperature sensor). In this circuit a bias voltage of about 0.050 volts is provided by the divider ratio resistors 8 and 9. 0.050 volts is the base emitter voltage at the required operating temperature (typically 80 Degrees C.) of transistor 3 when its collector current is determined by resistor 10. Depending on the processing characteristics of transistor 3 the temperature coefficient of its base emitter voltage is highly predictable and is around −2 mV/deg C. Thus if the chip heats up transistor 3 will turn on more, reducing its collector voltage. This is then amplified by operational amplifier 11 and since it inverts relative to the collector of transistor 3 the voltage across the heater 4 is reduced, thus reducing the power dissipation and consequently controlling the chip temperature. However, this circuit typically exhibits the temperature hysteresis previously mentioned and the cause is contained in the chip itself. The magnitude varies from device to device but a permanent or semi-permanent (several days to recover) change of up to 10 parts per million (ppm) can be induced in the output reference voltage when operated at normal temperature following a short period at −10 deg C. This can easily occur in transport. Even power interrupts to the heater circuitry, allowing cooling to a more normal ambient temperature of 20 deg C., can cause a few ppm change in some devices.

In this example the hysterisis effects are almost completely removed by application of a conditioning signal 12 to the base of transistor 3. Many examples of conditioning signal are possible and that illustrated in FIG. 2 has shown great success.

Figure 3:
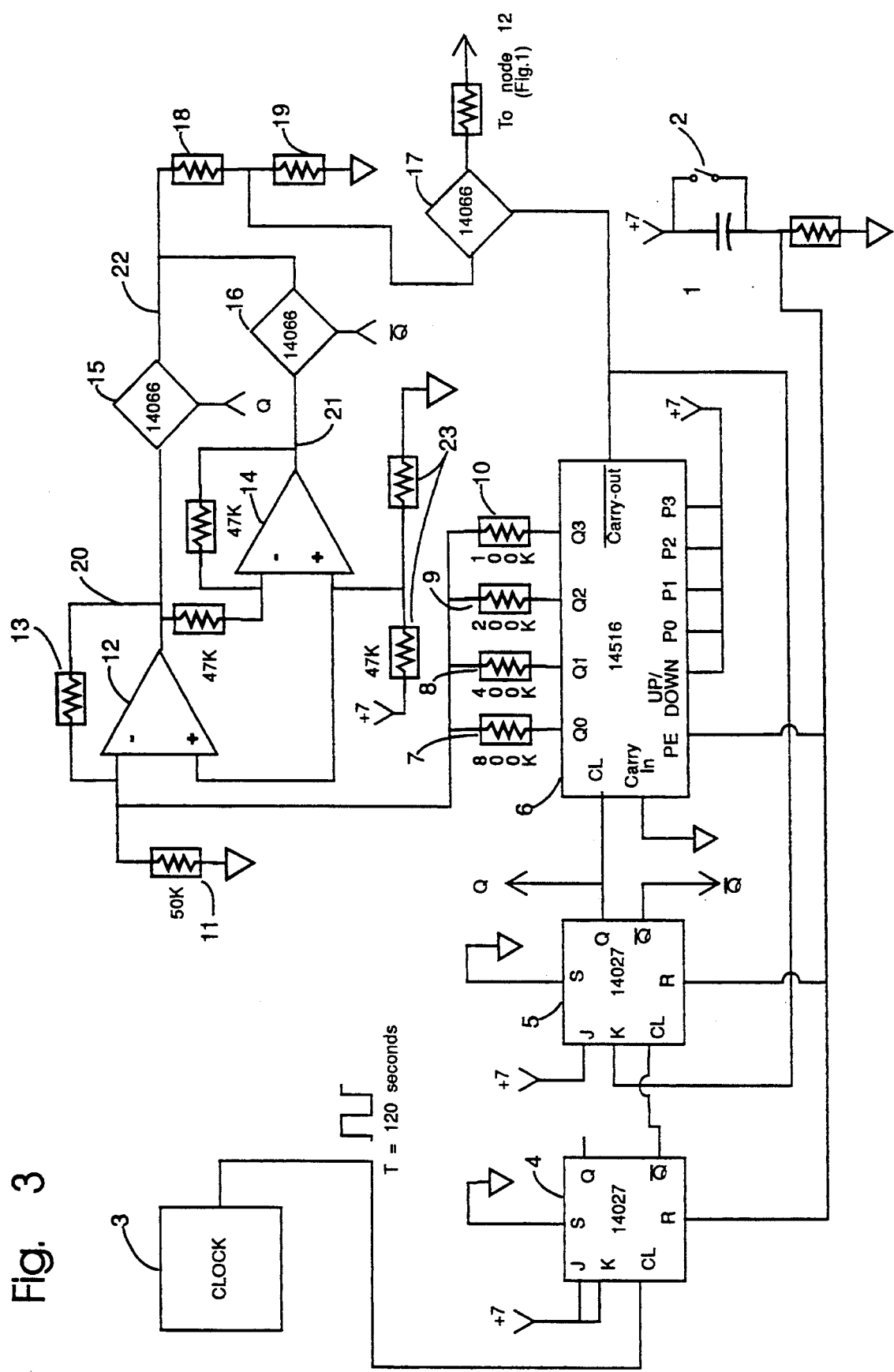
FIG. 3. is a circuit diagram of an apparatus in accordance with the invention for generation of the control voltage of FIG. 2, and FIGS. 4 and 5 are diagrams illustrating voltage waveforms occurring in the circuit of FIG. 3 during operation thereof.

In this example the bias voltage determined by resistors 8 and 9 (which determines the chip temperature) is varied with an approximately symmetrical, reducing magnitude, cyclical waveform lasting for 15 cycles derived from a 4 bit CMOS counter. The initial amplitude of the first cycle is 80 mV in this example thus causing a temperature change of about 40 deg C. Thus if the normal operating temperature is 80 deg C. then during the first cycle the temperature will change down to 40 deg C. and up to 120 deg C. Subsequent cycles will cause reduced magnitude changes, each excursion reducing by about 5 deg C. until the complete conditioning period of 15 cycles of around 500 seconds each is completed and the bias value left at its normal operating magnitude. An example of circuitry to perform this operation is shown in FIG. 3. and utilises counting and Digital to Analogue convertor techniques. Other examples are possible including analogue techniques or even methods that utilise the device's own thermal time constant to induce a damped oscillation of appropriate magnitude.

Figure 2:
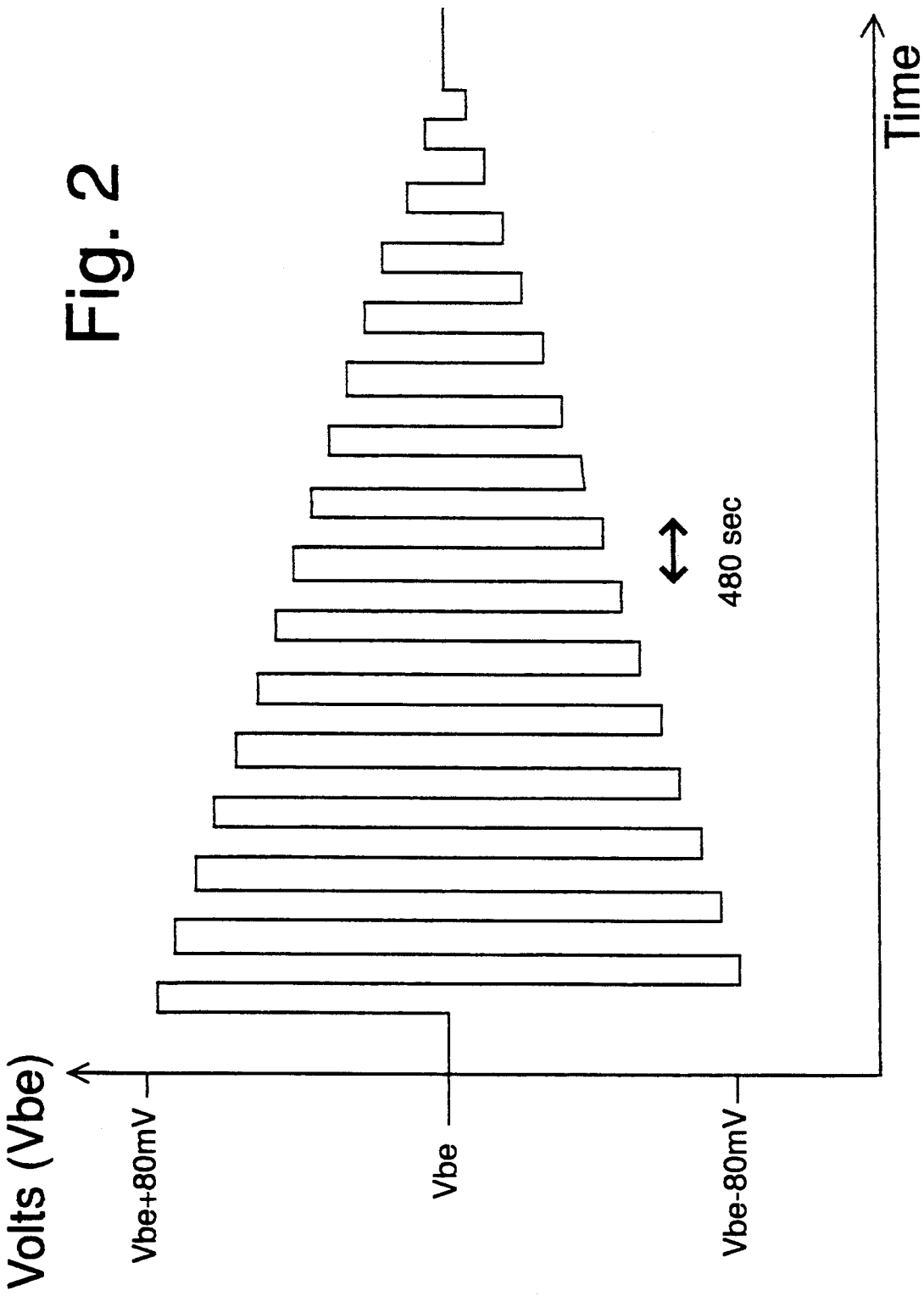
FIG. 2. is a diagram illustrating the waveform of a control voltage applied to the circuit of FIG. 1 in accordance with one embodiment of the invention.
Figure 4:
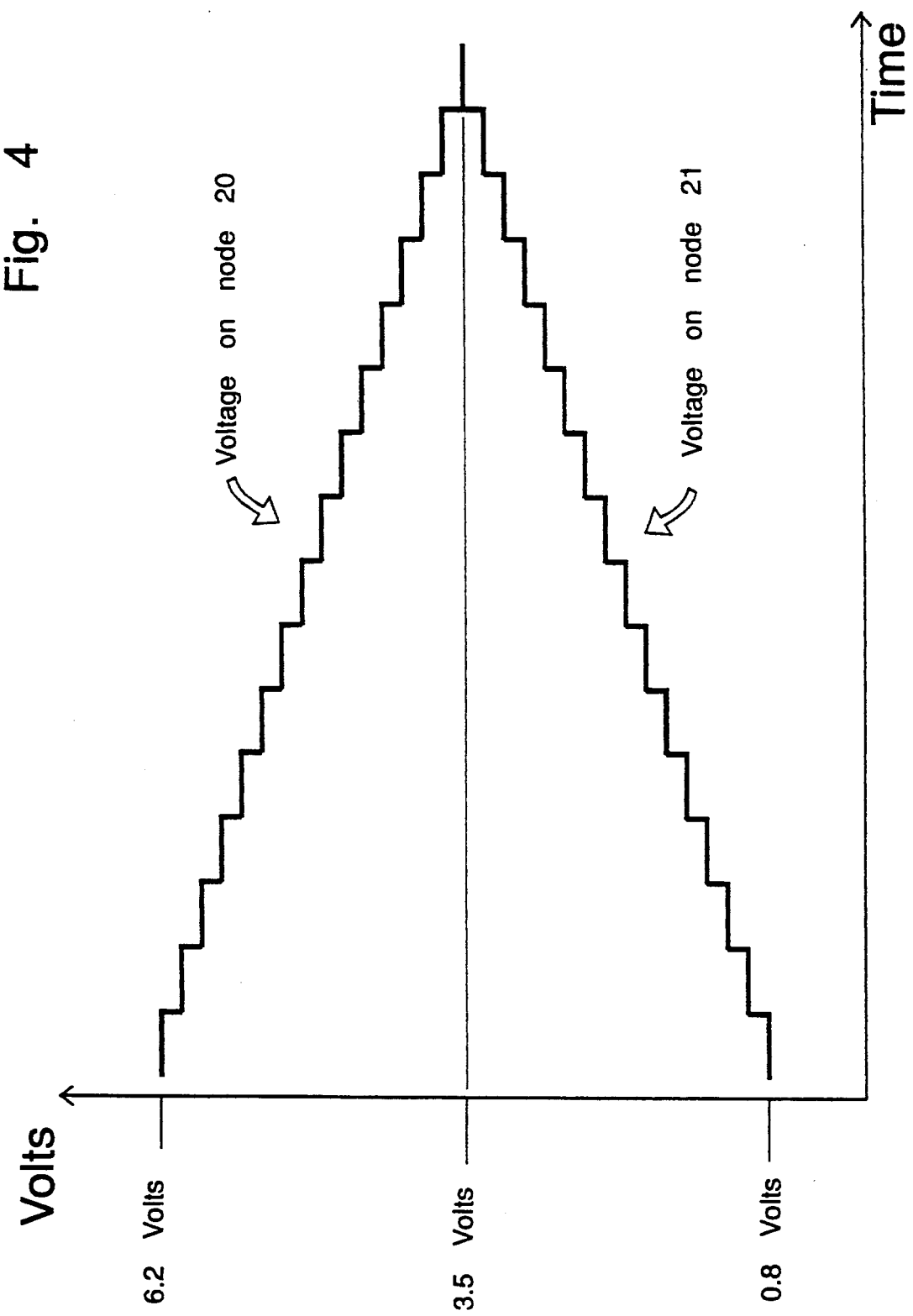

FIG. 3. shows an example circuit for generating a waveform for the conditioning period similar to that shown in FIG. 2. The values are not critical and the CMOS counter and JK flip flop are well known to those versed in the art, and their functions fully described in many manufacturers' data books. Power supply connections are not shown and are not critical in value except that the magnitude of voltage excursions of the output waveform is derived from the power supplies and so the resistor values are chosen to suit particular power supply values and in the sample shown assume that the power supply potential is 7 volts derived directly from the zener reference output value. The circuit works as follows:

On power up capacitor 1 ensures that JK. flip flops 4 and 5 and counter 6 are preset with the Q outputs of the JKs LOW (0 V) and the Q outputs of the counter, 6, HIGH (7 V) and the carry-out LOW (0 V). This condition may also be set by closing the switch 2. The clock 3 generates a clock waveform at the desired frequency to produce the desired cycle frequency of heating and cooling. In this case this represents a period of 120 seconds to give a complete positive and negative heat excursion cycle (about nominal) of 8 minutes. This timing is not critical but needs to be slower than the thermal time-constant if full magnitude heating and cooling is to occur. With the carry-out of counter 6 LOW, analogue gate 17 is held OFF so that the output is OFF the reference circuit of FIG. 1. runs at its nominal temperature. Due to the charging current into capacitor 1 from the resistor connected between it and 0 V, after a period of time the reset is removed allowing flip flops 4 and 5 to toggle as they are clocked. As the Q output of flip flop 5 goes HIGH counter 6 counts to its zero state, that is with all its Q outputs LOW and the carry-out HIGH resulting in analogue switch 17 being turned ON. The resistors connected to the Q outputs of counter 6 are binary weighted and pull or push current into the virtual earth (-pin) of op amp 12 depending on the Q states of counter 6. The reference level for op amps 12 and 14 is set by resistive divider 23 to be about half the supply volts. The potential at node 20 therefore starts by being determined by all the resistors 7,8,9,10,11 being in parallel and connected to 0 V, (The Q output resistance of counter 6 is low compared to the resistor values), the gain defining resistor 13 and the bias reference point determined by resistive divider 23. With the values shown this is approximately;

$$(-3.5V/50K-3.5V/100K-3.5V/200K-3.5V/400K-3.5V/800K) \times -20K+3.5 \text{ Volts}$$

giving approximately 6.2 volts. Each subsequent count adds 1 to the binary state of the Q outputs of counter 6 which can be shown to reduce the voltage on node 20 by $(7/800K) \times 20K = 0.175$ volts. Eventually the Q outputs all reach a HIGH state with the carry-out LOW which is fed back to the K input of JK flip flop 5 which inhibits further counts until the circuit is reset. The output on node 20 is portrayed by FIG. 4. which also shows the output on node 21 which is merely the inverse of node 20 derived by op amp invertor 14.

For each count of counter 6 flip flop 5 toggles and since its Q and $\overline{Q}$ outputs are connected to analogue switches 15 and 16 respectively node 22 is connected first to node 20 and then to node 21. This gives the waveform shown in FIG. 5 on node 22. This voltage can be scaled with resistors 18 and 19 to give the correct amplitude and offset to drive the conditioning signal into 12 of FIG. 1., resulting in a waveform on node 12 of FIG. 1. similar to that shown in FIG. 2. When the 15 count is reached carry-out of counter 6 goes LOW which turns off analogue gate 17 ensuring that the circuit does not effect the operating temperature when the conditioning period is completed.

The preceding description is intended as a guide only in order to describe the basic principle and has been somewhat simplified. Many circuit variations are possible to provide useful results.

It will be appreciated, for example, that a circuit such as described above will normally be incorporated in a complete measuring or reference apparatus, and that the conditioning function provided by the circuit described may be carried out in a mode of operation distinct from the normal mode of operation of the apparatus, either upon power up, or by selection of the conditioning mode by operation of the switch 2, which may be a manually operable switch.

I claim:

1. A method of conditioning an electronic component having a characteristic subject to distortion following a change in temperature, wherein, prior to operating the component at a given temperature, the temperature of the component is controlled to vary relatively to said given temperature in such a direction and for such a period of time as to remove any inherent change in said characteristic due to temperature hysteresis effects, wherein said component is included in an electronic circuit, and the circuit is caused to operate during said controlled variation of temperature.

2. A method according to claim 1, wherein said temperature is controlled by increasing the temperature of the component above said given temperature for a predetermined period of time.

3. A method according to claim 2, wherein said temperature is increased by increasing the component's power dissipation for the controlled period.

4. A method according to claim 1, wherein said controlled temperature variation is effected in a plurality of cycles.

5. A method according to claim 4 wherein said cycles of temperature variation are arranged to provide controlled temperatures that are sequentially above and below the normal operating temperature of said component.

6. A method according to claim 4 wherein the magnitude of the temperature excursion is reduced with continuing cycles of operation during the conditioning period.

7. A method as claimed in claim 4 wherein the duration of each cycle of temperature excursion, from the normal operating temperature, during the conditioning period is greater than 2 seconds.

8. A method according to claim 1 wherein the component is a zener reference element.

9. A method as claimed in claim 8 wherein the operating temperature of the zener reference element is controlled by use of an on-chip heater and heat sensor.

10. A method as claimed in claim 9 wherein the magnitude of the temperature excursions is controlled by the duration for which power is connected to the heater.

11. A method as claimed claim 1 wherein a plurality of components are contained on a common substrate and the substrate temperature is controlled by adjusting power dissipation in a heater placed in thermal contact with the substrate.

12. A method as claimed in claim 11 wherein the magnitude of the temperature excursions is controlled by the duration for which power is connected to the heater.

13. A method according to claim 1 wherein the component is a precision resistor.

14. An electrical apparatus including a voltage reference component, a temperature responsive characteristic of said voltage reference component being influenced during operation of the apparatus by a temperature control means of the apparatus that is arranged to maintain said component at a predetermined, normal, operating temperature, said apparatus having a mode of operation wherein conditioning of said component is effected by operation of said temperature control means to vary the temperature of the component relatively to said normal temperature in such a direction and for such a period of time as to remove any inherent change in said characteristic due to temperature hysteresis effects, wherein said component is included in an electronic circuit, and the arrangement is such that said circuit is caused to operate during said mode of operation.

15. An apparatus according to claim 14, wherein the arrangement is such that said temperature is varied during said conditioning by increasing the temperature of the component above said normal temperature for a predetermined period of time.

16. An apparatus according to claim 15, wherein the arrangement is such that said temperature is increased by increasing the component's power dissipation for the controlled period.

17. An apparatus according to claim 14, wherein the arrangement is such that said controlled temperature variation is effected in a plurality of cycles.

18. An apparatus according to claim 17 wherein the arrangement is such that said cycles of temperature variation are arranged to provide controlled temperatures that are sequentially above and below the normal operating temperature of said component.

19. An apparatus according to claim 17 wherein the arrangement is such that the magnitude of the temperature excursion is reduced with continuing cycles of operation during the conditioning period.

20. An apparatus as claimed in claim 17 wherein the arrangement is such that the duration of each cycle of temperature excursion, from the normal operating temperature, during the conditioning period is greater than 2 seconds.

21. An apparatus according to claim 14 wherein the said component is a zener reference element.

22. An apparatus as claimed in claim 21 wherein the arrangement is such that the operating temperature of the zener reference element is controlled by use of an on-chip heater and heat sensor.

23. An apparatus as claimed in claim 22 wherein the arrangement is such that the magnitude of the temperature excursions is controlled by the duration for which power is connected to the heater.

24. An apparatus as claimed claim 14 wherein a plurality of components are contained on a common substrate and the arrangement is such that the substrate temperature is controlled by adjusting power dissipation in a heater placed in thermal contact with the substrate.

25. An apparatus according to claim 14, wherein said apparatus is arranged to enter said conditioning mode of operation upon initial powering up of the apparatus, and prior to normal operation wherein said component serves as a reference.

26. A method of operating an electric device having a circuit incorporating an electronic component comprising a semiconductor chip, said method comprising the steps of powering the device in two consecutive modes of operation, the first mode being a conditioning mode and the second mode being a normal mode wherein the device performs a function relying upon predetermined characteristics of the said electronic component at a given temperature, said conditioning mode comprising subjecting said component to heating and cooling in a plurality of consecutive cycles wherein the temperature of the semiconductor chip is varied between upper and lower limits substantially above and below said given temperature.

27. A method according to claim 26, wherein in said conditioning mode the upper and lower limits of temperature to which said component is heated and cooled are progressively reduced towards a mean value substantially equal to said given temperature.

28. A method according to claim 26, wherein said conditioning mode is carried out without calibration by means of any adjustable component of the device.

29. A method according to claim 26, wherein said semiconductor chip is a silicon chip, said device is arranged to operate in said normal mode with said chip at a temperature of about 80° C. and the upper and lower limits of temperature in said conditioning mode are about 120° C. and 40° C.

30. In an electronic device having a normal mode of operation in which a function of the device is dependent upon a temperature responsive characteristic of an electronic component of the device incorporating a semiconductor chip, said device including means for controlling the temperature of said semiconductor chip, the improvement wherein said device is provided with a programmed control means providing a conditioning mode of operation of the device wherein said temperature control means is operated to vary the temperature of said semiconductor chip in a plurality of consecutive cycles wherein the chip is heated and cooled to upper and lower limits of temperature substantially exceeding the limits of temperature of said chip occurring during said normal mode of operation, whereby any inherent change in the said temperature responsive characteristic of the device due to hysteresis is removed without the requirement for recalibration of the device.

31. The improvement of claim 30, wherein the arrangement is such that the limits of temperature to which said chip is heated and cooled in said conditioning mode are progressively reduced towards a mean value of temperature lying within the limits of temperature at which said chip is maintained during said normal mode of operation.

32. The improvement of claim 30, wherein said semiconductor chip is a silicon chip, said device is arranged to operate in said normal mode with said chip at a temperature of about 80° C. and the upper and lower limits of temperature in said conditioning mode are about 120° C. and 40° C.

* * * * *

UNITED STATES PATENT AND TRADEMARK OFFICE
CERTIFICATE OF CORRECTION

PATENT NO. : 5,369,245
DATED : Nov. 29, 1994
INVENTOR(S) : John R. Pickering

It is certified that error appears in the above-indentified patent and that said Letters Patent is hereby corrected as shown below:

Column 2, lines 56 and 57, "0.050 volts" should read "0.50 volts".

Signed and Sealed this

Sixteenth Day of May, 1995

Attest:

BRUCE LEHMAN

Attesting Officer        Commissioner of Patents and Trademarks